United States Patent [19]

Hsu

[11] Patent Number: 4,782,307

[45] Date of Patent: Nov. 1, 1988

[54] FEED-FORWARD MICROWAVE AMPLIFIER ARRANGEMENT WITH FERRITE TEMPERATURE COMPENSATION

[75] Inventor: Rui T. Hsu, Lawndale, Calif.

[73] Assignee: Hughes Aircraft Company, Los Angeles, Calif.

[21] Appl. No.: 59,081

[22] Filed: Jun. 8, 1987

[51] Int. Cl.[4] .......................... H03F 1/00; H03F 3/60
[52] U.S. Cl. .................................... 330/151; 330/286
[58] Field of Search ............... 330/124, 149, 151, 289, 330/286, 53

[56] References Cited

U.S. PATENT DOCUMENTS

| | | | |
|---|---|---|---|
| 2,592,716 | 4/1952 | Lewis | 179/171 |
| 3,471,798 | 10/1969 | Seidel | 330/149 |
| 3,649,927 | 3/1972 | Seidel | 330/124 |
| 3,886,470 | 5/1975 | O'Neil et al. | 330/149 |

OTHER PUBLICATIONS

P. D. Lubell, "Linearizing Amplifiers for Multi-Signal Use", *Microwaves*, Apr. 1974, pp. 46–50.
F. Reggia et al., "A New Technique in Ferrite Phase Shifting for Beam Scanning of Microwave Antennas", *Proceedings of the IRE*, Nov. 1957, pp. 1510–1517.

*Primary Examiner*—Gene Wan
*Attorney, Agent, or Firm*—Paul M. Coble; Terje Gudmestad; A. W. Karambelas

[57] ABSTRACT

A feed-forward microwave amplifier arrangement is disclosed havaing an error-detecting loop including a main amplifier branch and a phase-shift branch, as well as an error-canceling loop including an auxiliary amplifier branch and a phase-shift branch. A temperature compensating arrangement including a ferrite slab centrally mounted in a stepped rectangular waveguide is provided in the phase-shift branch of the error-canceling loop. The temperature compensating arrangement has a phase versus temperature characteristic similar to that of the auxiliary amplifier. An additional ferrite temperature compensating arrangement, having a phase versus temperature characteristic similar to that of the main amplifier, may be provided in the phase-shift branch of the error-detecting loop.

24 Claims, 1 Drawing Sheet

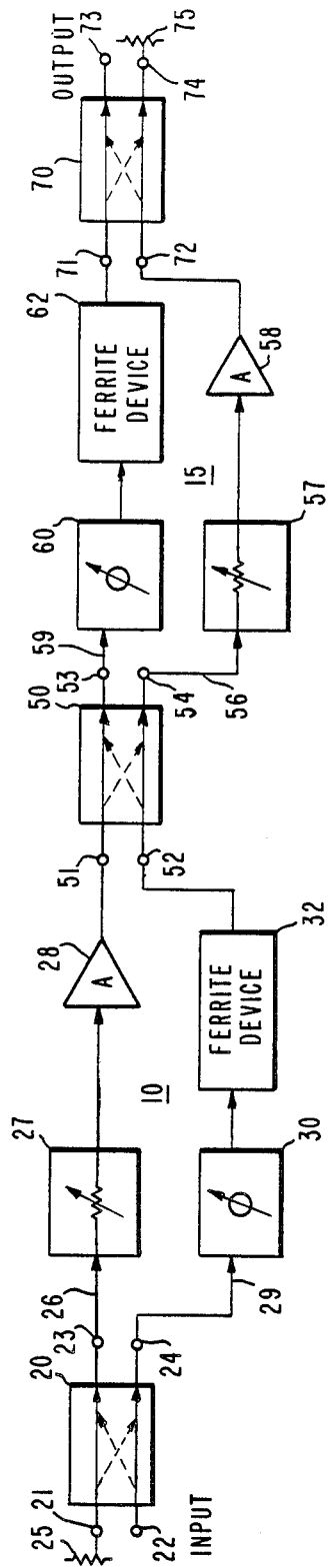
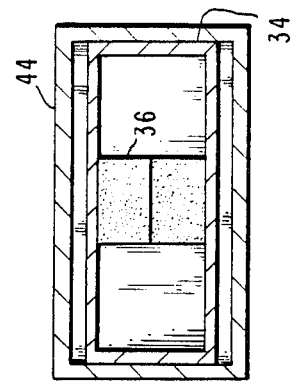
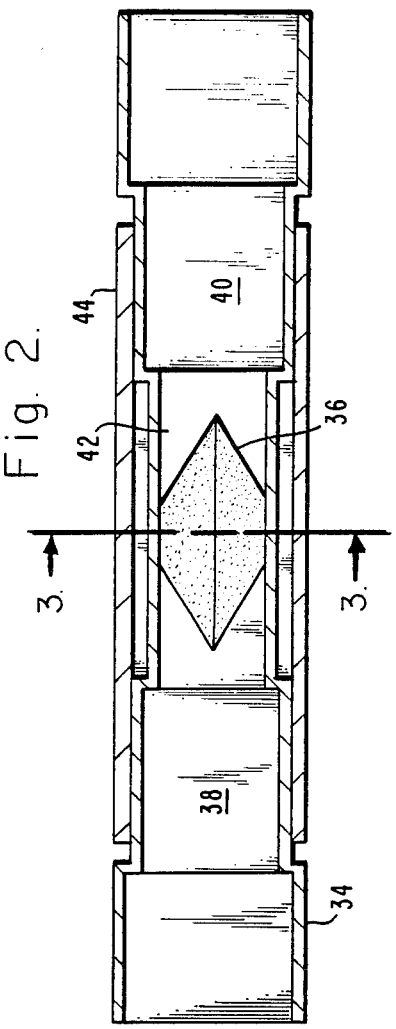

FEED-FORWARD MICROWAVE AMPLIFIER ARRANGEMENT WITH FERRITE TEMPERATURE COMPENSATION

TECHNICAL FIELD

This invention relates generally to microwave amplifiers, and more particularly relates to a feed-forward amplifier arrangement incorporating ferrite temperature compensation.

BACKGROUND OF THE INVENTION

Feed-forward techniques are finding increasing use in a variety of microwave communications systems. A particular application in which feed-forward amplifiers are especially useful is in multichannel amplitude modulated link (AML) transmitters for community antenna television (CATV) systems.

Typical feed-forward amplifier arrangements are designed to cancel distortion introduced by a main amplifier. Samples of the signal being processed are obtained both before and after the main amplifier and are compared to obtain an error signal. The error signal is amplified in an auxiliary amplifier and combined with the distortion-containing signal from the main amplifier such that cancelation of the distortion components occur. For further details concerning feed-forward microwave amplifiers, reference may be made to U.S. Pat. No. 2,592,716 to W. D. Lewis, U.S. Pat. Nos. 3,471,798 and 3,649,927 to H. Seidel, U.S. Pat. No. 3,886,470 to W. A. O'Neil et al., and to the publication by P. D. Lubell, "Linearizing Amplifiers for Multi-Signal Use", *Microwaves*, April 1974, pp. 46–50.

Applications such as CATV transmitters require that the feed-forward microwave amplifier arrangements be located outdoors; hence such arrangements may be subjected to wide variations of ambient temperature. Since the characteristics of the actual amplifying devices employed vary with temperature, the temperature range over which previous feed-forward microwave amplifier arrangements are able to provide effective distortion cancelation is limited.

SUMMARY OF THE INVENTION

It is an object of the present invention to provide a feed-forward microwave amplifier arrangement which maintains a low-distortion output signal over a wider range of ambient temperatures than heretofore has been achieved.

It is a further object of the invention to provide a simple and reliable feed-forward microwave amplifier arrangement with reduced temperature sensitivity.

In a feed-forward microwave amplifier arrangement according to the invention, a microwave input signal is applied to a first signal path including a main amplifier and to a second signal path in which the relative phase of the signals traversing the first and second paths are adjusted. Signals from the first and second paths are combined to provide an amplified signal containing distortion introduced by the main amplifier and an error signal representative of the introduced distortion. The error signal is applied to a third signal path including an auxiliary amplifier, and the amplified signal containing distortion is applied to a fourth signal path in which the relative phase of the signals traversing the third and fourth paths is adjusted and which contains a temperature compensating arrangement including ferrite material for providing a phase versus temperature characteristic similar to that of the auxiliary amplifier. Signals from the third and fourth paths are combined such that an amplified replica of the error signal substantially cancels the distortion on the amplified signal.

In a further embodiment of the invention the second signal path contains an additional temperature compensating arrangement including ferrite material for providing a phase versus temperature characteristic similar to that of the main amplifier.

Additional objects, advantages, and characteristic features of the present invention will become readily apparent from the following detailed description of preferred embodiments of the invention when considered in conjunction with the accompanying drawings.

DESCRIPTION OF THE DRAWINGS

In the accompanying drawings

FIG. 1 is a block diagram illustrating a feed-forward microwave amplifier arrangement according to the invention;

FIG. 2 is a longitudinal sectional view showing a ferrite temperature compensation device which may be used in the amplifier arrangement of FIG. 1; and FIG. 3 is a cross-sectional view taken along line 3—3 of FIG. 2.

DETAILED DESCRIPTION OF THE INVENTION

Referring to FIG. 1 with greater particularity, there is shown a feed-forward microwave amplifier arrangement comprising an error-detecting loop 10 and an error-canceling loop 15. An input microwave signal to be amplified, which typically may be of a frequency in the vicinity of 13 GHz, for example, is fed to the error-detecting loop 10 via an input directional coupler 20. As shown in FIG. 1, the input coupler 20 may be a four-port device having a first port 21, a second port 22, a third port 23 and a fourth port 24. In the arrangement of FIG. 1 the input signal is applied to the second port 22, while the first port 21 is terminated by means of a termination 25. As a specific example for illustrative purposes, the input coupler 20 may be a 6 db coupler, although it should be understood that other couplers providing different coupling values are also suitable and may be employed instead. The input directional coupler 20 conveys the input signal at the second port 22 to the fourth port 24 directly but provides at the third port 23 a replica of the input signal attenuated by a predetermined amount (6 db in the case of a 6 db coupler).

The attenuated signal at port 23 is fed along an amplification path 26 to a variable attenuator 27 and a main amplifier 28 coupled in series. As a specific example for illustrative purposes, the variable attenuator 27 may be a resistance slab movable in a waveguide, while the amplifier 28 may be a gallium arsenide field effect transistor (FET) amplifier. The signal at port 24 is fed via a phase-shift path 29 to a variable phase shifter 30 and a ferrite temperature compensating device 32 coupled in series. However, the order of the ferrite device 32 and the variable phase shifter 30 may be reversed from that shown in FIG. 1. Also as will be discussed in more detail below, in one embodiment of the invention the ferrite device 32 may be omitted from the error-detecting loop 10 and employed only in the error-canceling loop 15. As a specific example for illustrative purposes, the variable phase shifter 30 may be a dielectric slab movable in a waveguide, although it should be understood that other variable phase shifters are also suitable and may be employed instead.

The ferrite temperature compensating device 32 is shown in more detail in FIGS. 2 and 3. The device 32 includes a rectangular waveguide 34 in which there is mounted a ferrite slab 36. The height (shorter cross-sectional dimension) of the waveguide 34 is stepped inwardly near its respective ends to provide respective impedance-transforming input and output portions 38 and 40, respectively. The ferrite slab 36 is centrally mounted in the center (narrow) portion of the waveguide 34 between the input and output portions 38 and 40. As shown in FIG. 3, the ferrite slab 36 contacts the opposing broader walls of the waveguide 34 but is spaced from the opposing narrower waveguide walls, and as may be seen from FIG. 2, the respective ends of the slab 36 are tapered inwardly from the broader waveguide walls to facilitate impedance matching.

The material of the slab 36 is preferably magnesium-manganese with zinc substitution, a specific exemplary material being ferrite TT-1-3000 sold by Trans-Tech, Inc. It should be understood, however, that other ferrite materials may also be suitable and alternatively may be employed. A layer 44 of high permeability magnetic material is disposed about the central portion of the waveguide 34 containing the ferrite slab 36 and the longitudinally inner portions of the respective input and output impedance-transforming portions 38 and 40, respectively, to shield the slab 36 from external magnetic fields. A specific exemplary material for the layer 44 is Co-netic AA foil sold by the Magnetic Shield Division of Perfection Mica Company, although it should be understood that other materials are also suitable and may be employed instead.

Referring again to FIG. 1, the output signals from paths 26 and 29 of the error-detecting loop 10 are applied to the error-canceling loop 15 via a sampling directional coupler 50. The directional coupler 50, which may be similar to the coupler 20, has a first port 51, a second port 52, a third port 53, and a fourth port 54. The first port 51 receives the output signal from amplification path 26, while the output signal from the phase-shift path 29 is applied to the second port 52. As was explained above with respect to the input coupler 20, the sampling coupler 50 conveys the signal at port 51 to port 53 and the signal at port 52 to port 54 directly, but provides at port 53 an attenuated replica of the signal at port 52 and provides at port 54 an attenuated replica of the signal at port 51. The coupling value provided by the sampling coupler 50 determines the gain of the feed-forward amplifier and may be 25 db, for example.

The signal at port 54 is fed along an amplification path 56 to a variable attenuator 57 and an auxiliary amplifier 58 coupled in series. The variable attenuator 57 and the auxiliary amplifier 58 may be the same as the attenuator 27 and the amplifier 28, respectively, although the attenuator 57 and the auxiliary amplifier 58 may be designed to provide different amounts of attenuation and amplification than the corresponding components in the loop 10.

The signal at port 53 of the sampling coupler 50 is fed along a phase-shift path 59 to a variable phase shifter 60 and a ferrite temperature compensating device 62 coupled in series, although the order of the ferrite device 62 and the phase shifter 60 may be reversed from that shown in FIG. 1. The phase shifter 60 may be the same as the phase shifter 30 in the loop 10, while the ferrite device 62 may be the same as the ferrite device 32 and may have the specific construction illustrated in FIGS. 2 and 3. It is pointed out, however, that the ferrite device 62 is included in the error-canceling loop 15 in all embodiments of the present invention regardless of whether or not the ferrite device 32 is present in the error-detecting loop 10.

The signals from paths 56 and 59 of the error-canceling loop 15 are combined in an output directional coupler 70. The output coupler 70, which may be similar to the input coupler 20, includes a first port 71, a second port 72, a third port 73, and a fourth port 74. The first port 71 receives the output signal from phase-shift path 59, while the second port 72 receives the output signal from the amplification path 56. The third port 73 provides the overall output signal from the arrangement of FIG. 1, while the fourth port 74 is terminated by means of termination 75. The output directional coupler 70 conveys the signal at port 71 to port 73 while also providing at port 73 a replica of the signal at port 72 attenuated by a predetermined amount, for example, 8.5 db.

Before operating the feed-forward amplifier arrangement of FIG. 1, the variable attenuator 27 in the error-detecting loop 10 is adjusted such that the net loss for signals traveling from input coupler port 22 to sampling coupler port 54 via the path 26 (i.e., through port 23, attenuator 27, main amplifier 28, and port 51) is equal to that for signals traveling from port 22 to the port 54 via the path 29 (i.e., through port 24, phase shifter 30, ferrite device 32, and port 52). The variable phase shifter 30 is adjusted to provide a phase shift such that signals arriving at port 54 via path 29 are 180 out of phase with respect to signals reaching port 54 via path 26. Similarly, the variable attenuator 57 in the error-canceling loop 15 is adjusted such that the net loss for signals traveling from sampling coupler port 51 to output coupler port 73 via the path 56 (i.e., through port 54, attenuator 57, auxiliary amplifier 58, and port 72) is equal to that for signals traveling from port 51 to the port 73 via the path 59 (i.e., through port 53, phase shifter 60, ferrite device 62, and port 71). In addition, the variable phase shifter 60 is adjusted to provide a phase shift such that signals arriving at port 73 via path 59 are 180 out of phase with respect to signals reaching port 73 via path 56.

In the operation of the feed-forward amplifier arrangement of FIG. 1, the microwave input signal applied to input port 22 is fed via input coupler 20 to both amplification path 26 and phase-shift path 29. In the path 26 the signal is amplified by main amplifier 28. However, since the amplifier 28 introduces some distortion, the signal arriving at sampling coupler port 51 is not only an amplified version of the input signal, but also contains distortion. Since the net loss experienced by signals traveling from input port 22 to sampling coupler port 54 via paths 26 and 29 is the same, the respective replicas of the input signal reaching port 54 via the paths 26 and 29 will cancel one another due to the 180° phase difference in these signals. However, the distortion introduced by the amplifier 28 will appear at port 54. Moreover, since the path through the sampling coupler 50 from port 51 to port 53 provides negligible attenuation, the signal at port 53 will be an amplified version of the input signal, together with the distortion introduced by the amplifier 28.

Since the net loss experienced by signals traveling from port 51 to output port 73 via path 56 is the same as that experienced by signals traversing path 59, and due to the 180° phase difference between these paths, the distortion present at port 51 that reaches output port 73 via path 56 will substantially cancel that which reaches output port 73 via path 59. However, the amplified replica of the input signal at port 53 appears at output port 73 and, due to the aforementioned distortion cancelation, without the distortion introduced by the main amplifier 28. It should be noted that the auxiliary amplifier 58 will introduce some distortion which is not canceled. However, this distortion is much smaller than the original distortion introduced by the main amplifier 28, and the microwave output signal at port 73 will be relatively distortion-free.

Since the phase shift experienced by signals being amplified in the amplifiers 28 and 58 can vary significantly as a function of the temperature to which the amplifiers 28 and 58 are exposed, without the ferrite devices 32 and 62 the desired phase relationship between the signals traversing different paths through the loops 10 and 15 could not be maintained over a range of temperatures. However, the ferrite devices 32 and 62 provide a phase versus temperature characteristic closely matching that of the respective amplifiers 28 and 58. As a result, in the arrangement of FIG. 1, the desired phase relationship between signals traversing the loops 10 and 15 in the amplification and phase-shift paths is maintained over a wide range of temperatures. Thus, the feed-forward amplifier arrangement of FIG. 1 is relatively insensitive to temperature, and provides a low-distortion output signal over a wide range of ambient temperatures.

It should be noted that since cancelation of the amplifier distortion actually occurs in the loop 15, the ferrite device 62 in the loop 15 provides a greater performance improvement than the ferrite device 32 in the error-detecting loop 10, and a feed-forward amplifier arrangement according to the invention without the ferrite device 32 in the loop 10 still achieves excellent temperature compensation. Inclusion of the ferrite device 32 in the loop 10, however, affords even better performance.

Although the present invention has been shown and described with reference to particular embodiments, nevertheless, various changes and modifications obvious to a person skilled in the art to which the invention pertains are deemed to lie within the spirit, scope, and contemplation of the invention.

What is claimed is:

1. A feed-forward microwave amplifier arrangement comprising:
   a first signal path including a main amplifier;
   a second signal path including means for adjusting the relative phase of signals traversing said first and second paths;
   a third signal path including an auxiliary amplifier;
   a fourth signal path including means for adjusting the relative phase of signals traversing said third and fourth paths and temperature compensating means including ferrite material for providing a phase versus temperature characterisitic similar to that of said auxiliary amplifier coupled in series;
   means for applying a microwave input signal to said first and second paths;
   means for combining signals from said first and second paths to provide an amplified signal containing distortion introduced by said main amplifier and an error signal representative of said distortion and for applying said error signal to said third path and said amplified signal containing distortion to said fourth path; and
   means for combining signals from said third and fourth paths such that an amplified replica of said error signal substantially cancels the distortion on said amplified signal.

2. A feed-forward microwave amplifier arrangement according to claim 1 wherein said main and auxiliary amplifiers are gallium arsenide field-effect transistor amplifiers.

3. A feed-forward microwave amplifier arrangement according to claim 2 wherein said ferrite material is magnesium-manganese with zinc substitution.

4. A feed-forward microwave amplifier arrangement according to claim 1 wherein said temperature compensating means includes a rectangular waveguide defining inward steps along its shorter cross-sectional dimension near its respective ends to provide respective impedance-transforming input and output portions, and a slab of ferrite material mounted in the portion of said waveguide between said input and output portions.

5. A feed-forward microwave amplifier arrangement according to claim 4 wherein said slab is disposed in contact with opposing broader walls of said waveguide and spaced from opposing narrower walls of said waveguide, the respective ends of said slab being tapered inwardly from said broader waveguide walls.

6. A feed-forward microwave amplifier arrangement according to claim 4 wherein a shield of high permeability magnetic material is disposed about said portion of said waveguide containing said ferrite slab and about the longitudinally inner portions of said input and output portions of said waveguide.

7. A feed-forward microwave amplifier arrangement comprising:
   a first signal path including a main amplifier;
   a second signal path including means for adjusting the relative phase of signals traversing said first and second paths and first temperature compensating means including ferrite material for providing a phase versus temperature characteristic similar to that of said main amplifier coupled in series;
   a third signal path including an auxiliary amplifier;
   a fourth signal path including means for adjusting the relative phase of signals traversing said third and fourth paths and second temperature compensating means including ferrite material for providing a phase versus temperature characterisitic similar to that of said auxiliary amplifier coupled in series;
   means for applying a microwave input signal to said first and second paths;
   means for combining signals from said first and second paths to provide an amplified signal containing distortion introduced by said main amplifier and an error signal representative of said distortion and for applying said error signal to said third path and said amplified signal containing distortion to said fourth path; and
   means for combining signals from said third and fourth paths such that an amplified replica of said error signal substantially cancels the distortion on said amplified signal.

8. A feed-forward microwave amplifier arrangement according to claim 7 wherein said main and auxiliary amplifiers are gallium arsenide field-effect transistor amplifiers.

9. A feed-forward microwave amplifier arrangement according to claim 8 wherein said ferrite material is magnesium-manganese with zinc substitution.

10. A feed-forward microwave amplifier arrangement according to claim 7 wherein said first and second temperature compensating means each includes a rectangular waveguide defining inward steps along its shorter cross-sectional dimension near its respective ends to provide respective impedance-transforming input and output portions, and a slab of ferrite material mounted in the portion of said waveguide between said input and output portions.

11. A feed-forward microwave amplifier arrangement according to claim 10 wherein said slab is disposed in contact with opposing broader walls of said waveguide and spaced from opposing narrower walls of said waveguide, the respective ends of said slab being tapered inwardly from said broader waveguide walls.

12. A feed-forward microwave amplifier arrangement according to claim 10 wherein a shield of high permeability magnetic material is disposed about said portion of said waveguide containing said ferrite slab and about the longitudinally inner portions of said input and output portions of said waveguide.

13. A feed-forward microwave amplifier arrangement comprising:
  first, second, and third directional couplers, each having first, second, third, and fourth ports;
  first termination means coupled to the first port of said first directional coupler;
  means for applying a microwave input signal to the second port of said first directional coupler;
  a variable attenuator and a main amplifier coupled in series between the third port of said first directional coupler and the first port of said second directional coupler;
  a variable phase shifter coupled between the fourth port of said first directional coupler and the second port of said second directional coupler;
  a variable attenuator and an auxiliary amplifier coupled in series between the fourth port of said second directional coupler and the second port of said third directional coupler;
  a variable phase shifter and temperature compensating means including ferrite material for providing a phase versus temperature characteristic similar to that of said auxiliary amplifier coupled in series between the third port of said second directional coupler and the first port of said third directional coupler;
  second termination means coupled to the fourth port of said third directional coupler; and
  means for obtaining an output microwave signal from the third port of said third directional coupler.

14. A feed-forward microwave amplifier arrangement according to claim 13 wherein said main and auxiliary amplifiers are gallium arsenide field-effect transistor amplifiers.

15. A feed-forward microwave amplifier arrangement according to claim 12 wherein said ferrite material is magnesium-manganese with zinc substitution 16. A feed-forward microwave amplifier arrangement according to claim 13 wherein said temperature compensating means includes a rectangular waveguide defining inward steps along its shorter cross-sectional dimension near its respective ends to provide respective impedance-transforming input and output portions, and a slab of ferrite material mounted in the portion of said waveguide between said input and output portions.

17. A feed-forward microwave amplifier arrangement according to claim 16 wherein said slab is disposed in contact with opposing broader walls of said waveguide and spaced from opposing narrower walls of said waveguide, the respective ends of said slab being tapered inwardly from said broader waveguide walls.

18. A feed-forward microwave amplifier arrangement according to claim 16 wherein a shield of high permeability magnetic material is disposed about said portion of said waveguide containing said ferrite slab and about the longitudinally inner portions of said input and output portions of said waveguide.

19. A feed-forward microwave amplifier arrangement comprising:
  first, second, and third directional couplers, each having first, second, third, and fourth ports;
  first termination means coupled to the first port of said first directional coupler;
  means for applying a microwave input signal to the second port of said first directional coupler;
  a variable attenuator and a main amplifier coupled in series between the third port of said first directional coupler and the first port of said second directional coupler;
  a variable phase shifter and first temperature compensating means including ferrite material for providing a phase versus temperature characteristic similar to that of said main amplifier coupled between the fourth port of said first directional coupler and the second port of said second directional coupler;
  a variable attenuator and an auxiliary amplifier coupled in series between the fourth port of said second directional coupler and the second port of said third directional coupler;
  a variable phase shifter and second temperature compensating means including ferrite material for providing a phase versus temperature characteristic similar to that of said auxiliary amplifier coupled in series between the third port of said second directional coupler and the first port of said third directional coupler;
  second termination means coupled to the fourth port of said third directional coupler; and
  means for obtaining an output microwave signal from the third port of said third directional coupler.

20. A feed-forward microwave amplifier arrangement according to claim 19 wherein said main and auxiliary amplifiers are gallium arsenide field-effect transistor amplifiers.

21. A feed-forward microwave amplifier arrangement according to claim 20 wherein said ferrite material is magnesium-manganese with zinc substitution.

22. A feed-forward microwave amplifier arrangement according to claim 19 wherein said first and second temperature compensating means each includes a rectangular waveguide defining inward steps along its shorter cross-sectional dimension near its respective ends to provide respective impedance-transforming input and output portions, and a slab of ferrite material mounted in the portion of said waveguide between said input and output portions.

23. A feed-forward microwave amplifier arrangement according to claim 22 wherein said slab is disposed in contact with opposing broader walls of said waveguide and spaced from opposing narrower walls of said waveguide, the respective ends of said slab being tapered inwardly from said broader waveguide walls.

24. A feed-forward microwave amplifier arrangement according to claim 22 wherein a shield of high permeability magnetic material is disposed about said portion of said waveguide containing said ferrite slab and about the longitudinally inner portions of said input and output portions of said waveguide.

* * * * *